Figure 1:
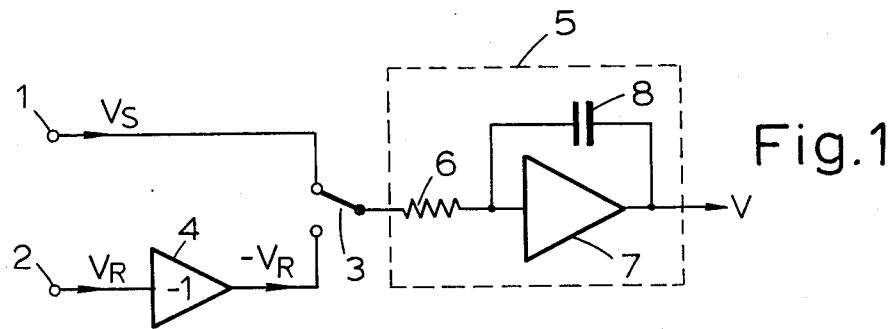

United States Patent [19]
Flynn et al.

[11] 3,995,265
[45] Nov. 30, 1976

[54] ANALOGUE DIVIDER WITH DIGITAL OUTPUT FOR SPECTROPHOTOMETRY

[75] Inventors: Adrian Francis Flynn, Huntingdon; Paul Goring Houghton, Haslingfield, both of England

[73] Assignee: Pye of Cambridge Ltd., Cambridge, England

[22] Filed: Nov. 19, 1974

[21] Appl. No.: 525,155

[30] Foreign Application Priority Data
Dec. 3, 1973 United Kingdom............... 55929/73

[52] U.S. Cl.................... 340/347 NT; 340/347 AD
[51] Int. Cl.²......................................... H03K 13/20
[58] Field of Search............. 340/347 NT, 347 AD; 324/99 D

[56] References Cited
UNITED STATES PATENTS

| 3,772,683 | 11/1973 | Dorey | 340/347 NT |
| 3,826,983 | 7/1974 | Garratt | 340/347 NT |
| 3,833,902 | 9/1974 | Eto | 340/347 NT |
| 3,842,416 | 10/1974 | Eto | 340/347 NT |

Primary Examiner—Charles D. Miller
Attorney, Agent, or Firm—Frank R. Trifari; Ronald L. Drumheller

[57] ABSTRACT

The sample output from a spectrophotometer is accumulated for a predetermined number of clock pulses and then compared with an accumulation of the reference output of the spectrophotometer and predetermined antenuations thereof for measured numbers of clock pulses to produce digitalized transmittance or absorbance ratios.

9 Claims, 6 Drawing Figures

ANALOGUE DIVIDER WITH DIGITAL OUTPUT FOR SPECTROPHOTOMETRY

The present invention relates to an analogue divider with digital output, that is to say, an analogue-to-digital converter whose digital output is dependent upon the ratio of two analogue input signals, for use with a spectrophotometer, and to a spectrophotometer including such an analogue divider.

In spectrophotometry it is necessary to measure the amount of radiation passing through an unknown sample and to compare this with a known reference. For example, in a known spectrophotometer of the double beam type, a beam of radiation from a source such as the exit slit of a monochromator is arranged to traverse alternately two similar optical paths, the first passing through a suitable cell containing the sample material and the second passing through a similar cell containing a reference material. The radiation from the two paths is then directed on to a common radiation detector which produces an electrical output signal proportional to the intensity of the radiation incident upon it. Where a ratio measuring system is used, the output of the detector is switched alternately, in synchronism with the optical beam switching, to the inputs of a first and a second sample-and-hold circuit, such that the output $V_S$ of the first sample-and-hold circuit is proportional to the intensity $I_S$ of radiation reaching the detector via the sample cell and the output $V_R$ the second sample-and-hold circuit is proportional to the intensity $I_R$ of the radiation reaching the detector via the reference cell.

If the intensities of radiation incident respectively on the sample and reference cells are equal and if the sample cell contains for example a sample of a substance of interest dissolved in a suitable solvent while the reference cell contains pure solvent, then the difference between $I_S$ and $I_R$ will depend solely on the absorption of incident radiation by the sample material. Furthermore $I_R$ will be equal to the intensity of the radiation incident on the sample, since the effects of the solvent and of the cells themselves will be the same in both paths.

It is usually required to determine both the transmittance T and the absorbance A of the sample where transmittance is defined as the ratio of the intensity of the transmitted radiation to the intensity of the incident radiation ($T = I_S/I_R$) while absorbance A is related to transmittance by the expression $A = -\log_{10}T$
Therefore $$T = V_S/V_R \text{ and } A = \log_{10}V_R/V_S \ (= \log_{10}V_R - \log_{10} V_S)$$

Arrangements are known in which the logarithms of $V_R$ and $V_S$ are obtained by analogue methods and the resulting signals are subtracted to give an analogue output signal representing absorbance. This signal may then be inverted and its antilog taken to obtain an analogue signal representing transmittance. These output signals may be displayed on suitably-scaled meters or may be applied to drive a chart recorder. For many applications a digital read-out is required. Although this may be obtained by applying the analogue transmittance or absorbance signal to an analogue-to-digital converter, such arrangements are limited by stability problems in the analogue circuits, and are unable to take advantage of the high resolution capability of digital read-outs.

An object of the present invention is to enable improved accuracy of measurement of the ratio of the sample output analogue signal to the reference output analogue signal of a spectrophotometer compared with the known arrangements described in the above paragraph.

According to the invention there is provided an analogue divider with digital output for use with a spectrophotometer, including an integrator, a source of clock pulses, first control means adapted to connect the sample output analogue signal of the spectrophotometer to the integrator input for the duration of a predetermined number of clock pulses, a first counter, and second control means including an increment counter for the first counter, the second control means being adapted, in response to the completion of said predetermined number of clock pulses, to admit clock pulses to the first counter and to connect to the integrator input, during p successive counting cycles of the first counter, a signal of value $-V_R/n^x$, where:

$V_R$ is the reference signal analogue output of the spectrophotometer, $n$ is the radix of the number system of the first counter, and $x = p-1$ for the first cycle, decreasing by unity for each cycle, the second control means also being adapted to pre-set the most significant stage of the first counter to the value 1 at the beginning of the second and successive cycles and to block the admission of clock pulses to the first counter when the integrator output reaches zero, the arrangement being such that the state of the first counter and of the increment counter when the integrator output reaches zero together provide a digital output which can be processed to give the transmittance and/or the absorbance value of the sample.

For use with a double beam spectrophotometer, the invention further provides an analogue divider as described in the previous paragraph, and in which said first control means includes a second counter, means adapted to pre-set the second counter to a value which provides beam balance correction at the frequency at which the sample is measured, and means adapted to admit clock pulses to the second counter and to simultaneously connect the sample output analogue signal of the spectrophotometer to the integrator input until the second counter completes a counting cycle.

With the analogue divider as described in either of the previous two paragraphs, the state of the first counter and of the increment counter when the integrator output reaches zero may be transferred to a computer for processing to give the transmittance and/or the absorbance value of the sample. The analogue divider may however, according to a preferred feature of the invention, include read-out means with drive means adapted to show the transmittance value of the sample on a floating point digital display and/or with drive means adapted to show the absorbance value of the sample on a fixed point digital display.

The analogue divider as described in any of the previous three paragraphs may be provided as an add-on unit for a spectrophotometer. Alternatively, as a further preferred feature of the invention, a spectrophotometer can include the analogue divider and a suitable digital display or displays.

Figure 2:
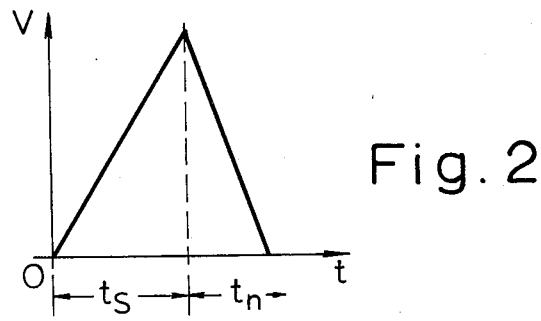
Figure 4:
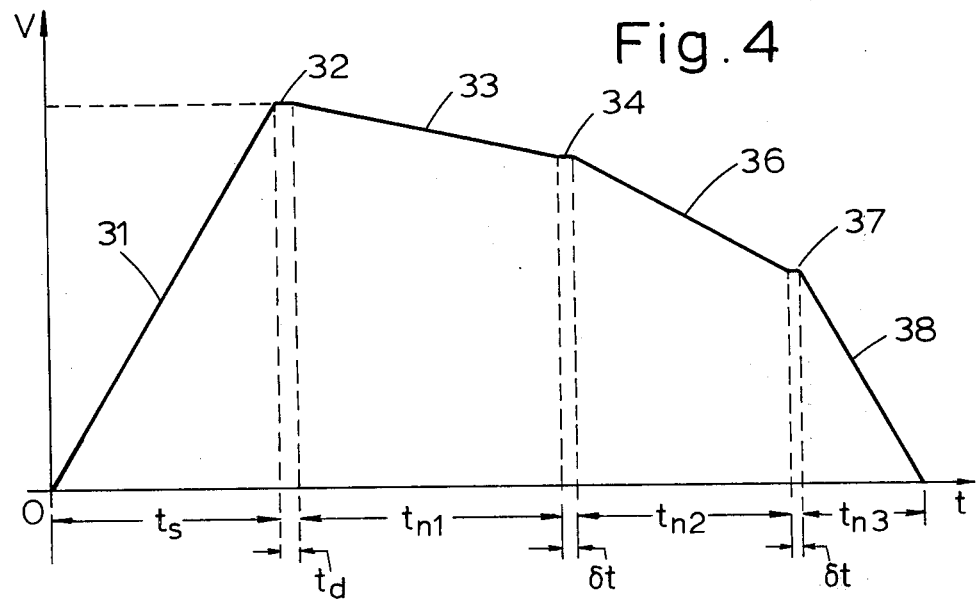
Figure 3:
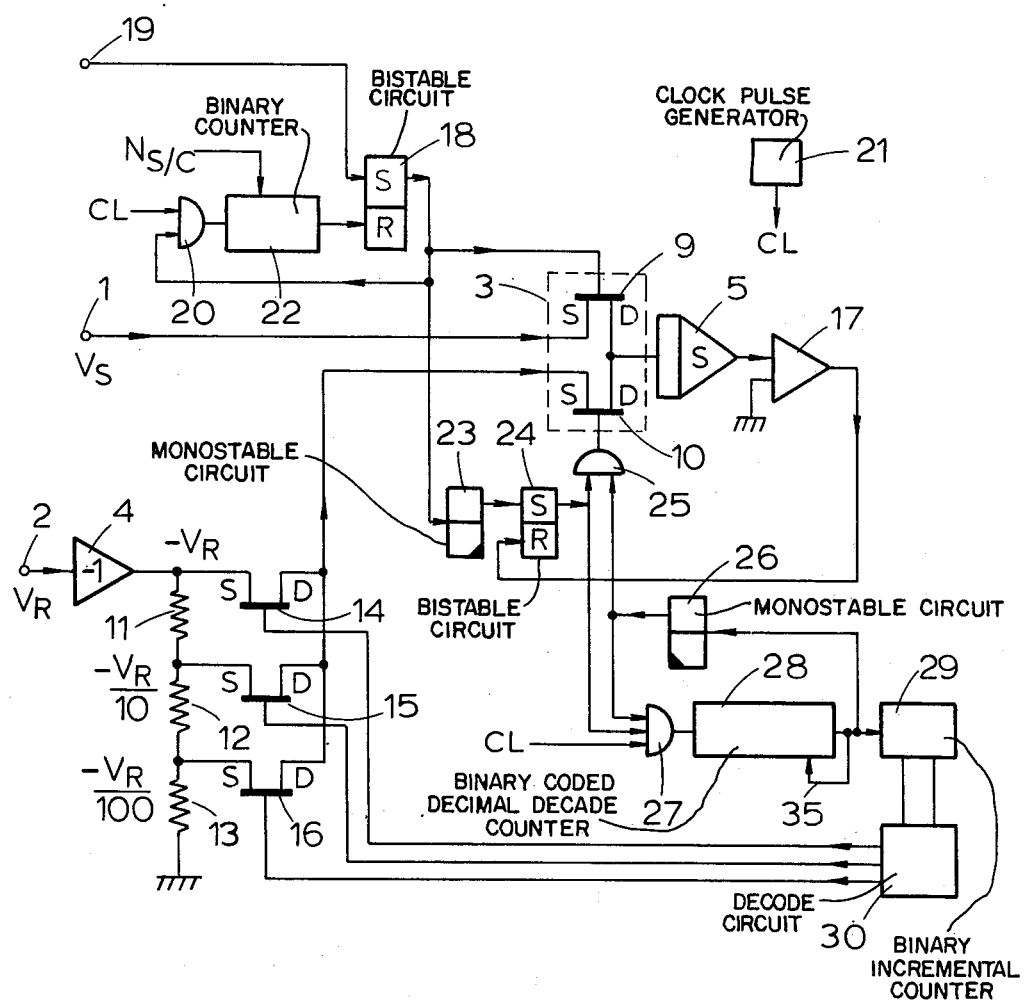
Figure 5:
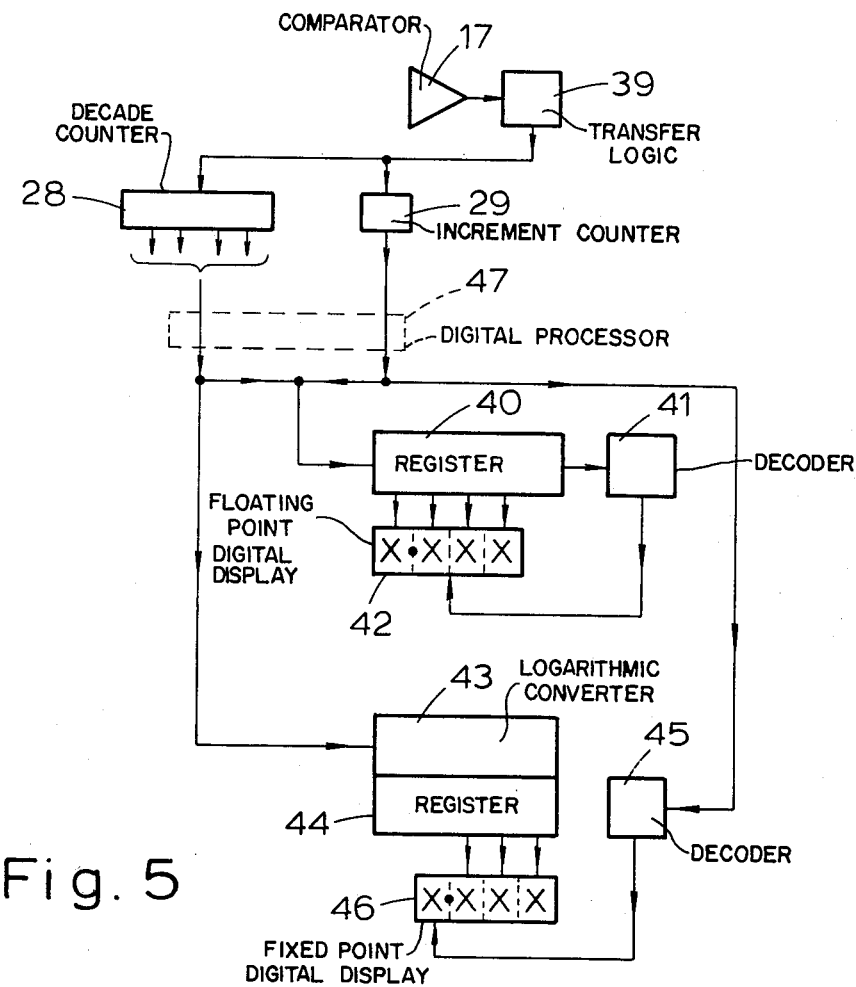
Figure 6:
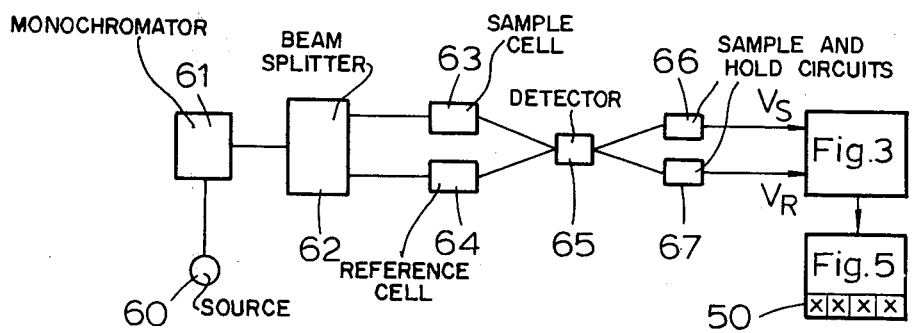

The invention will now be described in more detail with reference to the accompanying drawings, of which:

FIG. 1 is a schematic diagram illustrating a principle which is used in the invention, FIG. 2 is a graphical representation of a voltage/time relationship in the circuit of FIG. 1, FIG. 3 is a block schematic diagram of part of an analogue divider according to the invention, FIG. 4 is a graphical representation of a voltage/time relationship in the circuit of FIG. 3, FIG. 5 is a block schematic diagram of the remainder of an analogue divider according to the invention, and FIG. 6 is a block schematic diagram of a spectrophotometer incorporating an analogue divider according to the invention.

Throughout the drawings, like reference numbers refer to like parts.

Consider first the arrangement of FIG. 1. The sample output analogue signal $V_S$ from a spectrophotometer not shown in the drawing is applied to an input terminal 1 and the reference output signal $V_R$ to an input terminal 2. The terminal 1 is connected to a first fixed contact of a two-way switch 3 and the terminal 2 is connected via a unity gain inverting amplifier 4 to a second fixed contact of the switch 3. The movable contact of the switch 3 is connected to an input of an integrator unit 5 comprising an input resistor 6, an operational amplifier 7 and a feedback capacitor 8.

Assume that the voltage V at the output of the integrator 5 is zero at a time $t_0$ when the switch 3 is moved to the position shown in FIG. 1, connecting the sample voltage $V_S$ to the input of the integrator. V will thereafter rise linearly, as shown in FIG. 2, at a rate determined by the magnitude of $V_S$ and the time constant RC determined by the value R of the resistor 6 and the value C of the capacitor 8. At the end of a time interval $t_s$, V attains a value $V_1$ determined by the relationship $$V_1 = V_S/RC \cdot t_s$$

The switch 3 is then reversed, connecting the output of the amplifier 4, i.e., the inverted reference signal $-V_R$, to the input of the integrator 5. Consequent on the reversal of the polarity of its input signal, the voltage V at the output of the integrator now falls linearly at a rate determined by the magnitude of $V_R$ and the time constant RC, reaching zero at the end of a further time interval $t_n$ such that $$V_1 = V_R/RC \cdot t_n$$

Therefore $$V_S/RC \cdot t_s = V_R/RC \cdot t_n$$

and $$V_S/V_R = t_n/t_s = T \quad (1)$$

If a counter is provided to count clock pulses of constant frequency $f$ during the time intervals $t_s$ and $t_n$, then the number of pulses counted during time $t_s$ is $N_s = t_s \times f$ and that during time $t_n$ is $N_n = t_n \times f$.
Then $$N_n/N_s = V_S/V_R$$

and if $N_s$ is held constant, then $$N_n \propto V_S/V_R$$

Thus the count $N_n$ is a direct digital representation of the transmittance T. Also, a digital conversion to the logarithmic complement of the count $N_n$ would be a digital representation of absorbance A.

To achieve measurement with a resolution of, for example, 1 in $10^6$ would require, according to the above-described arrangement, a counter with a capacity of 1 million bits. An analogue divider according to the invention will now be described which utilizes the principle of the above-described arrangement in a modified form so as to achieve a resolution of 1 in $10^6$ with a counter having a capacity of only 10,000 bits.

Referring now to FIG. 3, the input terminals 1 and 2 receive respectively the sample ($V_S$) and reference ($V_R$) analogue output signals from the sample-and-hold circuits of a spectrophotometer not shown in FIG. 3. The terminal 1 is connected to a first input of a switch unit 3 comprising the field-effect transistors 9 and 10 whose drain electrodes D are connected together and to the output of unit 3. The transistors 9 and 10 are switched between their conducting and non-conducting states by control signals applied to their respective gate electrodes, the arrangement being such that when the transistor 9 is conducting, the first input of the switch unit 3 is connected to its output, and when the transistor 10 is conducting, the second input is so connected.

The input terminal 2 is connected to the input of a unity-gain inverting amplifier 4. A potentiometer chain comprising resistors 11, 12 and 13 in series is connected between the output of the inverter 4 and a point of zero potential (earth). The source electrodes of field-effect transistors 14, 15 and 16 are connected respectively to the output of the amplifier 4, to the junction of the resistors 11 and 12 and to the junction of the resistors 12 and 13. The drain electrodes of the transistors 14, 15 and 16 are connected together and to the second input of the switch unit 3. The values of the resistors 11, 12 and 13 are so chosen that by selectively switching the transistors 14, 15 and 16 by control voltages applied to their respective gate electrodes, as will be more fully described hereinbelow, the signal applied to the second input of the switch unit 3 may have a value equal to the full output ($-V_R$) of the inverter 4, to $-V_R/10$ or to $-V_R/100$.

The output of the switch unit 3 is connected to the input of an integrator 5 whose output is connected to a first input of a comparator circuit 17. A second input of the comparator 17 is connected to ground.

An output of a bistable circuit 18 is connected to the gate electrode of the transistor 9 such that the transistor conducts when the bistable 18 is in the "set" condition. A "Convert Command" signal may be applied via an input terminal 19 to a "set" input of the bistable 18.

The output of the bistable 18 is further connected to an input of a gate 20 which has the output CL of a clock pulse generator 21 connected to its second input. The output of the gate 20 is connected to an input of a binary counter 22 whose output is connected to a "reset" input of the bistable 18. As will be more fully explained hereinbelow, provision is made for pre-setting the binary counter 22 to a desired initial count.

The output of the bistable 18 is further connected to an input of a monostable circuit 23 whose output is connected to a "set" input of a bistable circuit 24. The output of the bistable 24 is connected to a first input of a gate 25 and the output of a monostable circuit 26 is connected to a second input of the gate 25. The output of the gate 25 is connected to the gate electrode of the transistor 10, the arrangement being such that this transistor conducts only when the bistable 24 is in its "set" condition and the monostable 26 is in its stable state. The output of the comparator 17 is connected to the "reset" input of the bistable 24.

The outputs of the bistable 24 and the monostable 26 are further respectively connected to first and second inputs of a gate 27 whose third input is connected to the output CL of the clock pulse generator 21. The output of the gate 27 is connected to an input of a binary coded decimal decade counter 28. The most significant bit, M.S.B., output of the counter 28 is connected to the input of the monostable 26 and to the input of a binary incremental counter 29 whose individual stage outputs are connected to the inputs of a decode circuit 30. Outputs of the decode circuit 30 are connected to the gate electrodes of the transistors 14, 15 and 16.

The manner of operation is as follows:

Prior to the application of a "Convert Command" signal to the terminal 19, both the bistables 18 and 24 are in the "reset" condition and consequently the transistors 9 and 10 are both non-conducting. The monostables 23 and 26 are in their stable states. The gates 20 and 27 are both closed, so that no clock pulses are fed to the counters 22 and 28. The decade counter 28 and the incremental counter 29 are both at zero but the binary counter 22 is pre-set to the complement $N_{s/c}$ of the number $N_s$ corresponding to the sample integration time $t_s$. The decode circuit 30 provides output signals which switch the transistor 16 to the conductive state and bias off both of the transistors 14 and 15. The output V of the integrator 5 is zero.

When a "Convert Command" signal is applied, the bistable 18 is triggered to the "set" condition, switching on the transistor 9 and so applying the sample input signal $V_S$ to the integrator 5 whose output commences to rise linearly as shown at 31 in FIG. 4. The "set" output of the bistable 18 also opens the gate 20, allowing clock pulses to enter the binary counter 22. Counting continues until the counter completes a cycle and returns to zero. As soon as zero is attained at the most significant bit, M.S.B., output of the counter 22 (i.e., after $N_s$ clock pulses since the counter was pre-set to $N_{s/c}$), the bistable 18 is reset, switching off the transistor 9 and closing the gate 20. The input of the integrator 5 is then isolated and its output voltage is held at the level $V_1$.

The reset signal from bistable 18 also triggers the monostable 23 which reverts to its stable state after a delay $t_d$ (32, FIG. 4). The trailing edge of the monostable 23 output pulse triggers the bistable 24 into its "set" condition. Since the monostable 26 is already in its stable state, the transistor 10 is now switched on, and at the same time the gate 27 is opened, admitting clock pulses to the decade counter 28.

As previously stated, the transistors 14 and 15 are cut off and the transistor 16 is conducting. The $-V_R/100$ signal is therefore connected via the transistor 10 to the input of the integrator 5. The integrator output voltage commences to ramp down from the value $V_1$ as shown at 33 in FIG. 4. The delay $t_d$ produced by the monostable 23 ensures that the transistor 10 does not conduct until the transistor 9 is fully cut off, thus preventing transient disturbances at the input of the integrator 5.

While the integrator output ramps down at the $-V_R/100$ rate, clock pulses are counted in the decade counter 28 until the latter completes a cycle and returns to zero. The M.S.B. output signal from the counter 28 is fed into the incremental counter 29, and also triggers the monostable 26 which produces an output pulse of duration $\delta t$ (34, FIG. 4) effective to close both of the gates 25 and 27, thus switching the transistor 10 to the non-conducting state and also cutting off the counter 28 from the clock pulse source 21. The M.S.B. output of the counter 28 is additionally employed as shown at 35 in FIG. 3 to reset the most significant decade stage of the counter 28 to the 1 condition, thus changing the scale of the counter in readiness for the second counting cycle.

The decode circuit 30 responds to the change from zero to one of the number stored in the incremental counter by producing output signals which cut off the transistors 14 and 16 and cause the transistor 15 to conduct, connecting the $-V_R/10$ signal to the switch unit 3. The monostable 26 then returns to its stable state, opening the gates 25 and 27, thereby connecting the $-V_R/10$ signal to the input of the integrator 5 and permitting clock pulses to enter the counter 28. The duration $\Delta t$ of the monostable 26 pulse is such as to permit the various switching operations just described to be completed before the transistor 10 conducts, so that no switching transients disturb the integrator 5.

The integrator 5 output then ramps down at the $-V_R/10$ rate, as shown at 36 in FIG. 4, while clock pulses are again counted by the decade counter 28. This continues until the full count is again reached, when the monostable 26 is again triggered, the number stored in the incremental counter 29 is changed from one to two, and the last stage of the counter 28 is again pre-set to 1. The decode unit 30 cuts off the transistors 15 and 16 and switches on the transistor 14, connecting the $-V_R$ signal to the switch unit 3. After a delay $\delta t$ (37, FIG. 4), the monostable 26 reverts to its stable state and counting commences for the third cycle while the integrator output ramps down at the $-V_R$ rate (38, FIG. 4) until it reaches the zero volts level. At this point the comparator unit 17 produces an output signal which resets the bistable 24, thus closing the gates 25 and 27 and terminating the sequence.

An equation for the arrangement described with respect to FIGS. 3 and 4 which corresponds to the equation (1) hereinbefore is $$V_S/V_R = 1/t_x\left(t_{n1}/K_1 + t_{n2}/K_2 + t_{n3}/K_3\right) \quad (2)$$

where $K_1 = 100$, $K_2 = 10$ and $K_3 = 1$

Hence $$V_S/V_R = 1/N_x\left(N_1/100 + N_2/10 + N_3\right) \quad (3)$$

where $N_1$, $N_2$ and $N_3$ are the counts for the first, second and third cycles respectively.

If $N_s = 10^4$, then $V_S/V_R$ 1 equation (3) is satisfied when $N_1 = 10^4$, $N_2 = 9.10^3$ and $N_3 = 9.10^3$, since $$1/10^4 \left(10^4/10^2 + 9.10^3/101 + 9.10^3\right) = 1$$

Thus, with the capacity of the counter 28 being equal to the number of clock pulses $N_s$ required to complete a counting cycle of the counter 22, the sequence of three counting cycles of the counter 28 described above with reference to FIGS. 3 and 4 will be completed when the integrator 5 output reaches zero for a sample having a transmittance value of unity, $V_S/V_R = 1$. Where $N_s = 10^4$, then a four-stage decade counter 28 satisfies $N_1 = 10^4$. The most significant stage of the counter 28 being pre-set to the value 1 for the second and third cycles satisfies the requirement of equation (3) that $N_2 = 9.10^3$ and $N_3 = 9.19^3$.

For a sample having a transmittance value less than unity, the level $V_1$ to which the integrator output rises during the period $t_s$ is relatively low and the integrator 5 output will consequently ramp down to zero before the completion of three counting cycles of the counter 28. If $V_S/V_R = 0.1$, equation (3) is satisfied when $N_1 = 10^4$, $N_2 = 9.10^3$ and $N_3 = 0$, that is to say that the integrator 5 output will reach zero at the end of the second cycle. Similarly, if $V_S/V_R = 0.01$, the integrator 5 output will reach zero at the end of the first cycle.

It will now be apreciated that the state of the decade counter 28 and the increment counter 29 when the integrator output reaches zero together provide a digital output which can be processed to give the transmittance and/or the absorbance value of the sample. For example, if when the integrator 5 output reaches zero the four stages of the decade counter 28 hold, in order of significance, the decimal values 4732 and the increment counter 29 holds the value 1, then this corresponds to a transmittance value of 4.732% and an absorbance value of 1.325. The transmittance value has the same digits as the decimal values in the counter 28, with the position of the decimal point decoded from the value in the increment counter 29. The absorbance value has a fractional part which is the fractional part of the logarithmic complement of the decimal values in the counter 28, and an integer part which is decoded from the value in the increment counter 29.

Referring now to FIG. 5, circuits are shown for processing the digital output of the counters 28 and 29 as described in the previous paragraph and which can be included with the circuits shown in FIG. 3 to form an analogue divider which is a complete add-on unit for use with a spectrophotometer. The comparator 17, decade counter 28 and increment counter 29 which are part of the circuits shown in FIG. 3 are shown again in FIG. 5 together with their connections to processing circuits not shown in FIG. 3. In these processing circuits, transfer logic 39 responds to the output signal from the comparator 17 when the integrator 5 output reaches zero to read out the state of the decade counter 28 and the increment counter 29 into a register 40 which together with a decoder 41 drives a floating point digital display 42, and also into a logarithmic converter 43, 44 and decoder 45 which together drive a fixed point digital display 46.

The state of the four stages of the counter 28 and of the increment counter 29 is transferred to the five-stage register 40. The first four stages of the register 40 drive the digit indicators of the four-digit display 42 so that they display the decimal values of the four-stage counter 28. The fifth stage of the register 40 drives the decoder 41 to show the decimal point of the display 42 in the position appropriate to the state of the increment counter 29. For example, if the four stages of the decade counter 28 hold, in order of significance, the decimal values 4732, then the display 42 shows a percentage transmission value of 0.4732, 4.732, or 47.32 according to whether the number stored in the increment counter 29 is zero, one, or two, respectively.

The state of the four stages of the counter 28 is also transferred to a logarithmic converter 43 with a register 44. The converter 43 is adapted to supply to the register 44 the fractional part, to three significant figures, of the logarithmic complement to the base 10 of the decimal values in the counter 28, and the register 44 drives the three digit indicators to the right-hand side of the fixed decimal point of the four-digit display 46. The state of the counter 29 is transferred to the decoder 45 which drives the digit indicator of the display 46 on the left-hand side of the fixed decimal point. For example, if the four stages of the decade counter 28 hold, in order of significance, the decimal values 4732, then the display 46 shows an absorbance value of 2.325, 1.325, or 0.325 according to whether the number stored in the increment counter 29 is zero, one to two, respectively. The unit 47 shown in dotted outline relates to a possible modification of the arrangement so far described, and its significance will be explained later.

The outputs of the registers 40 and 44 and their respective decoders 41 and 45 may also be employed to drive data print-out devices etc.

It will be appreciated that by applying the reference signal $V_R$ to the integrator 5 in three succesive stages in fractional values of $10^{-2}$, $10^{-1}$ and 1, the integer part of the absorbance value is obtained independently, and logarithmic conversion is only required for the fractional part. Thus absorbance values up to 3 are obtained to an accuracy of 0.01 in $10^3$, i.e., 1 in $10^5$, and a resolution of 1 in $10^6$ with a counter 28 of capacity 10,000 bits.

Reference was previously made to the binary counter 22 being pre-set to a count $N_{s/c}$. The object of this is to provide a means of beam balance correction.

In the foregoing description it has been assumed that the beams falling on the sample and reference cells of the spectrophotometer are of equal intensities, so that any difference between the sample output signal $V_S$ and the reference signal $V_R$ is due solely to the absorption of radiation by the sample material. In a double beam spectrophotometer, however, variations in the relative intensities of the two beams occur as the light source is scanned over a range of frequencies. It is usual to equalize the intensities at a reference frequency during the setting-up of the spectrophotometer, e.g. by suitable adjustment of a beam balance attenuator placed in one of the optical paths. Departures from equality at other frequencies then follow a fixed law which is a function of the spectrophotometer design. A known method of compensating for these departures is to provide a cam profiled in accordance with the said law, which is mechanically coupled to the frequency scan drive of the monochromator and is effective to modify the setting of the beam balance attenuator so as to produce substantial equality of the two beams at all frequencies. Such mechanical methods are limited in accuracy and are difficult to manufacture and to adjust.

If at a given frequency the beam going into the sample cell is of greater intensity than the beam going into the reference cell, the consequence is that the resulting sample $V_S^1$ is greater than the value $V_S$ which would be produced if the intensities were equal. This may be compensated by integrating $V_S^1$ for a time $t_s^1$ such that the integrator output voltage attains the same value $V_1$ as when $V_S$ is integrated for a time $t_s$. Similarly, the condition in which $V_S^1$ is less than $V_S$ may be compensated by making $t_s^1$ greater than $t_s$. Since, in the arrangement described above with reference to FIG. 3, the sample integration time is determined by the number $N_s$ of clock pulses required to fill the counter 22 starting not from zero but from a pre-set value $N_{s/c}$, it may be varied by changing $N_{s/c}$.

At the reference frequency where the beam intensities have beem made equal, $N_{s/c}$ is chosen to give a value of $N_s$ corresponding to the nominal integration time $t_s$. In the present embodiment, $N_s = 10^4$. For other frequencies at which measurements are required, predetermined other values of $N_{s/c}$ may be inserted into the counter prior to the convert command signal being for each measurement. Since the value of $N_{s/c}$ may be varied in unitary steps, beam balance correction may be provided with an accuracy of 1 part in $10^4$.

Where the spectrophotometer is computer-controlled, suitable values of $N_{s/c}$ may be stored in the computer memory and called up as required when the programme demands a measurement at a specific frequency.

If it is not required to provide beam balance correction in the manner described above, then only a single value of $N_s = 10^4$ is required which is equal to the capacity of the decade counter 28. The arrangement shown in FIG. 3 could then be modified to eliminate the counter 22 and provide suitable gating with the decade counter 28 so that the sample analogue output signal $V_S$ of the spectrophotometer is applied to the integrator 5 input for the duration of a complete cycle of the counter 28.

The arrangements described above and shown in FIGS. 3 and 5 can, as has been previously mentioned, form an add-on unit for use with a spectrophotometer. They could, however, be built into a spectrophotometer. FIG. 6 shows a schematic diagram of a double beam spectrophotometer including a source 60, monochromator 61, beam splitter 62, sample and reference cells 63 and 64, detector 65, sample-and-hold circuits 66 and 67 for the sample signal $V_S$ and reference signal $V_R$ respectively and the arrangements of FIGS. 3 and 5. In this case, the digital displays 42 and 46 shown in FIG. 5 may be combined in a single display 50 shown in FIG. 6.

In the above description the state of the decade counter 28 and the increment counter 29 when the integrator 5 output reaches zero is processed by the arrangement shown in FIG. 5. However, it may also be desirable for the digital output of the counters 28 and 29 to be processed by a computer, that is to say, by circuits remote from the analogue divider of FIG. 3, whether that divider is an add-on unit or part of a spectrophotometer. In this case it may be more convenient to have the digital output of the counters 28 and 29 in binary form rather than binary-coded-decimal form. This is indeed possible within the scope of the invention. For example, an arrangement as shown in FIG. 3 modified so that the resistors 11, 12 and 13 connect values equal to $-V_R/64$, $-V_R/8$ and $-V_R$ in succession to the integrator 5 input and so that the counter 28 is an octal counter, having e.g. five stages, will satisfy an equation similar to equation (3). That is to say that the values are $-V_R/17_2$, $-V_R/n$ and $-V_R$, whre $n$ is the radix of the counter 28. In this case the arrangement of FIG. 5 will be modified by the interposition of a digital processor 47 into which is read the state of the counter 28 and the increment counter 29. The processor 47 will be adapted to convert the digital signals present at its input into binary coded decimal form and thus provide output information to the units 40, 43 and 45 equivalent to what would have been provided direct from the counter 28 and increment counter 29 if the counter 28 had been a decade counter.

Furthermore, the invention is not limited to the case where three cycles of the counter 28 are completed for a sample having a transmittance value of unity. In general terms, the arrangement of the invention connects to the integrator 5 input, during p successive counting cycles of the counter 28, a signal of value $-V_R/n^x$, where $x = p - 1$ for the first cycle, decreasing by unity for each cycle. The resolution of the analogue divider is in each case $n^{p-1}$ multiplied by the capacity of the counter 28.

What we claim is:

1. Apparatus for automatically computing the transmittance value of a sample from the reference and sample output analogue signals of a spectrophotometer, comprising:
   an integrator having an input and output;
   a source of clock pulses;
   means for connecting the sample output analogue signal of a spectrophotometer to the input of said integrator for a predetermined number of clock pulses;
   a first counter for counting clock pulses;
   means responsive to completion of said predetermined number of clock pulses for gating clock pulses to said first counter and for simultaneously connecting to the input of said integrator a signal having the value $-V_R/n^x$, where $V_R$ is the reference output analogue signal of the spectrophotometer, n is the radix of the digits of said first counter and $x$ is an integer;
   an incremental counter;
   means responsive to the return to zero of said first counter for incrementing said increment counter by one, decreasing $x$ by one and resetting the most significant digit of said first counter to one; and
   means for detecting when the output of said integrator reaches zero and for stopping clock pulses from reaching said first counter in response thereto, whereby the number in said first counter after said integrator reaches zero is the transmittance value of the sample with the position of the decimal point being determined by the number in said increment counter.

2. Apparatus as defined in claim 1 wherein said predetermined number of clock pulses is equal to the counting capacity of said first counter.

3. Apparatus as defined in claim 1 for use with a double beam spectrophotometer, wherein said means for connecting the sample output analogue signal to said integrator comprises:
   a second counter;
   means for gating clock pulses to said second counter and for simultaneously connecting the sample output analogue signal to the input of said integrator until said second counter returns to zero; and
   means for pre-setting said second counter to a value which provides beam balance correction.

4. Apparatus as defined in claim 1 and further comprising floating point digital display means responsive to said first counter for displaying the digits of said first counter, and a decoder responsive to said increment counter to drive the floating point of said display so that said display shows the transmittance value of the sample.

5. Apparatus as defined in claim 1 and further comprising a logarithmic converter responsive to said first counter for computing the logarithm of decimal number represented by the digits in said first counter, the decimal portion of said logarithm being the decimal portion of the absorbance value of the sample, the number in said increment counter being the integer portion of the absorbance value of the sample.

6. Apparatus as defined in claim 5 and further comprising fixed point digital display means responsive to said logarithmic converter and to said increment counter for displaying to the right and to the left of the fixed point respectively the decimal portion and the integer portion of the absorbance value of the sample.

7. Apparatus as defined in claim 1 wherein $n$ equals 10.

8. Apparatus as defined in claim 1 wherein $n$ equals 8.

9. Apparatus as defined in claim 1 wherein $x$ is initially set equal to 3.

* * * * *